United States Patent
Buchanan et al.

(10) Patent No.: US 6,756,646 B2
(45) Date of Patent: Jun. 29, 2004

(54) OXYNITRIDE GATE DIELECTRIC AND METHOD OF FORMING

(75) Inventors: Douglas Andrew Buchanan, Cortlandt Manor, NY (US); Matthew Warren Copel, Yorktown Heights, NY (US); Patrick Ronald Varekamp, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/862,372

(22) Filed: May 22, 2001

(65) Prior Publication Data

US 2003/0190780 A1 Oct. 9, 2003

Related U.S. Application Data

(62) Division of application No. 09/226,369, filed on Jan. 6, 1999, now Pat. No. 6,245,616.

(51) Int. Cl.[7] ................ H01L 31/062; H01L 31/113; H01L 31/119
(52) U.S. Cl. ............... 257/410; 257/411; 257/412; 257/413
(58) Field of Search .................. 257/411, 410, 257/347

(56) References Cited

U.S. PATENT DOCUMENTS

| | | | |
|---|---|---|---|
| 5,508,532 A | * | 4/1996 | Teramoto ............... 257/59 |
| 5,972,800 A | | 10/1999 | Hasegawa |
| 6,087,229 A | * | 7/2000 | Aronowitz et al. ...... 438/287 |

* cited by examiner

*Primary Examiner*—Long Pham
*Assistant Examiner*—Shrinivas H Rao
(74) *Attorney, Agent, or Firm*—Robert M. Trepp; Randy W. Tung

(57) ABSTRACT

A method for forming an oxynitride gate dielectric in a semiconductor device and gate dielectric structure formed by the method are disclosed. In the method, an oxynitride layer is first formed on a silicon surface and then re-oxidized with a gas mixture containing oxygen and at least one halogenated species such that an oxynitride layer with a controlled nitrogen profile and a layer of substantially silicon dioxide formed underneath the oxynitride film is obtained. The oxynitride film layer can be formed by either contacting a surface of silicon with at least one gas that contains. nitrogen and/or oxygen at a temperature of not less than 500° C. or by a chemical vapor deposition technique. The re-oxidation process may be carried out by a thermal process in an oxidizing halogenated atmosphere containing oxygen and a halogenated species such as HCl, $CH_2Cl_2$, $C_2H_3Cl_3$, $C_2H_2Cl_2$. $CH_3Cl$ and $CHCl_3$.

9 Claims, 2 Drawing Sheets

OXYNITRIDE GATE DIELECTRIC AND METHOD OF FORMING

CROSS-REFERENCE TO RELATED APPLICATION

This is a divisional application of U.S. application Ser. No. 09/226,369, filed Jan. 6, 1999, now U.S. Pat. No. 6,245,616.

FIELD OF THE INVENTION

The present invention generally relates to a gate dielectric for a semiconductor device and method of forming and more particularly, relates to an oxynitride gate dielectric structure that contains nitrided regions with controlled concentrations of nitrogen for use in a semiconductor device and method of forming the structure.

BACKGROUND OF THE INVENTION

Conventional gate dielectrics used in semiconductor memory devices consist of a thin $SiO_2$ layer. A recent trend in semiconductor processing has been the inclusion of a small concentration of nitrogen in the gate dielectric layer. It has been found that the nitrogen provides the beneficial effects of reducing channel hot electron damage and reducing boron out diffusion from the polysilicon gate into the channel. The inclusion of nitrogen further raises the dielectric constant so that a nitrided film has a lower leakage current than a pure oxide film that has an equivalent capacitance. Even though nitrogen has beneficial effects on gate insulators, too large a nitrogen concentration may be undesirable. Large nitrogen concentrations can cause unacceptable shifts in Vfb, as well as degradation in other properties of the dielectric.

There is little flexibility in the control of the concentration and depth distribution of nitrogen in most methods for introducing nitrogen into $SiO_2$. Chemical methods of introducing nitrogen rely on the reaction between a nitriding agent such as NO or $NH_3$ with the silicon substrate or a previously grown oxide. The resulting films have a large concentration of nitrogen at the $Si/SiO_2$ interface where the chemical reaction takes place. The reaction is self-limiting by the nitrogen since the nitrided layer acts as a diffusion barrier to oxygen and thus prevents further gas species from reaching the $Si/SiO_2$ interface. This provides an additional benefit of using nitrogen in a nitriding process, i.e., the nitrided films are more uniform in thickness than conventional oxides. The uniformity in thickness is demonstrated by the smaller distribution of electrical characteristics measured at different sites across a wafer surface treated with, for example, NO oxidation.

Some limited control of the nitrogen depth distribution has been attempted by others. One of the methods is to control the initial nitridation conditions. For example, it has been shown that the nitrogen content in an oxynitride layer created by exposing silicon to gaseous NO depends on the nitridation temperature. By reacting at a lower temperature, a smaller quantity of nitrogen is introduced, even though the quality of the resulting dielectric may be compromised by the lower reaction temperature. Another method for controlling the nitrogen depth distribution is by reoxidation of oxynitrides. For instance, it has been shown that a pure $SiO_2$ spacer layer can be inserted in between an oxynitride layer and a silicon substrate by exposing the sample to gaseous $O_2$ at elevated temperatures. The oxygen diffuses through the dielectric and reacts with the silicon substrate to form the underlying $SiO_2$ layer without disturbing the oxynitride film. It was also shown that nitrogen can be removed upon reoxidation by $N_2O$, even though it may be more desirable to leave a controlled amount of nitrogen in the oxynitride layer instead of the complete removal such that desirable benefits of nitrogen may be retained. It is therefore desirable to have a method that effectively controls the profile of nitrogen concentration in an oxynitride layer used as a gate dielectric, while simultaneously, after a reoxidation process of the oxynitride layer is carried out, forming a substantially pure $SiO_2$ layer underneath the dielectric.

It is therefore an object of the present invention to provide a method for forming an oxynitride gate dielectric in a semiconductor device that does not have the drawbacks or shortcomings of the conventional methods.

It is another object of the present invention to provide a method for forming an oxynitride gate dielectric in a semiconductor device that is capable of achieving a controlled profile of nitrogen concentration in the oxynitride.

It is a further object of the present invention to provide a method for forming an oxynitride gate dielectric in a semiconductor device that is capable of producing, after a re-oxidation process of oxynitride, a substantially pure $SiO_2$ layer underneath the dielectric.

It is another further object of the present invention to provide a method for forming an oxynitride gate dielectric in a semiconductor device which has a controlled nitrogen profile in the oxynitride layer by first forming the layer by contacting a surface of silicon with at least one gas that contains nitrogen and/or oxygen.

It is still another object of the present invention to provide a method for forming an oxynitride gate dielectric in a semiconductor device that has a controlled profile of nitrogen concentration by first forming the oxynitride layer on a silicon surface by a chemical vapor deposition technique.

It is yet another object of the present invention to provide a method for forming an oxynitride gate dielectric in a semiconductor device by first forming an oxynitride layer and then treating the layer with a gas mixture comprising oxygen and at least one halogenated species for forming a substantially silicon dioxide layer underneath the oxynitride layer.

It is another further object of the present invention to provide a method for forming an oxynitride gate dielectric in a semiconductor device by contacting a surface of silicon with at least one gas that contains nitrogen and/or oxygen selected from the group consisting of NO, $N_2O$, $NH_3$ and $O_2$.

It is yet another further object of the present invention to provide a gate dielectric situated in a semiconductor device that includes a spacer layer of substantially $SiO_2$ overlying a silicon substrate, an oxynitride layer overlying the spacer layer and a $SiO_2$ layer overlying the oxynitride layer.

It is still another further object of the present invention to provide a gate stack situated in a semiconductor memory device that includes a spacer layer of substantially $SiO_2$ overlying a silicon substrate, an oxynitride layer overlying the spacer layer, a silicon dioxide layer overlying the oxynitride layer and a conductive gate overlying the silicon dioxide layer.

SUMMARY OF THE INVENTION

In accordance with the present invention, a method for forming an oxynitride gate dielectric that has controlled nitrogen profile in a semiconductor device and gate dielectric formed by such device are provided.

In a preferred embodiment, a method for forming an oxynitride gate dielectric in a semiconductor device can be carried out by the operating steps of first providing a silicon substrate that has a top surface, and contacting the top surface of the silicon substrate with at least one gas that contains nitrogen and/or oxygen at a temperature of not less than 500° C. forming an oxynitride layer overlying the silicon substrate, and contacting the silicon substrate and the oxynitride layer with a gas mixture including oxygen and at least one halogenated species such that a layer of substantially silicon dioxide is formed between the oxynitride layer and the silicon substrate.

The at least one gas that contains nitrogen and/or oxygen can be selected from the group consisting of NO, $N_2O$, $NH_3$ and $O_2$. The at least one gas may be flown into a reaction chamber to react at a pressure between about 1 mTorr and about 20 atm. The at least one gas may be flown into a reaction chamber at a sufficiently high flow rate and chamber temperature such that a nitrogen-rich oxynitride having a nitrogen concentration in the range between about 0.1 and about 50 atomic percent can be formed. The at least one gas may be flown into a reaction chamber to react with a silicon surface that is kept at a temperature between about 500° C. and about 1200° C.

The method for forming an oxynitride gate dielectric may further include the step of contacting the top surface of a silicon substrate by at least one nitrogen-containing gas and at least one oxygen-containing gas. The method may further include the step of contacting a top surface of a silicon substrate with at least one gas selected from NO, $N_2O$ and $NH_3$ and at least one gas selected from $O_2$ and $N_2O$. The oxynitride layer formed may have a thickness between about 1 Å and about 40 Å. The at least one halogenated species may be selected from the group consisting of HCl, $CH_2C_2$, $C_2H_3C_3$, $C_2H_2C_2$. $CH_3Cl$ and $CHCl_3$. The layer of substantially silicon dioxide may be formed of 90% pure $SiO_2$.

In another preferred embodiment, a method forming an oxynitride gate dielectric may be carried out by first providing a silicon substrate which has a top surface, depositing a layer of oxynitride on the top surface of the silicon substrate by a chemical vapor deposition technique, and then forming a substantially silicon dioxide layer between the oxynitride layer and the silicon substrate by contacting the oxynitride layer with a gas mixture including oxygen and at least one halogenated species.

The chemical vapor deposition (CVD) technique utilized may be plasma CVD, remote plasma CVD, rapid thermal CVD and low pressure CVD. The oxynitride layer deposited may have a thickness between about 1 Å and about 40 Å. The at least one halogenated species may be selected from the group consisting of HCl, $CH_2Cl_2$, $C_2H_3Cl_3$, $C_2H_2Cl_2$. $CH_3Cl$ and $CHCl_3$. The layer of substantially silicon dioxide may be formed of 90% pure $SiO_2$.

The present invention is further directed to a gate dielectric situated in a semiconductor device that includes a silicon substrate, a spacer layer overlying the silicon substrate, the spacer layer may be formed of substantially $SiO_2$, an oxynitride layer overlying the spacer layer, and $SiO_2$ overlying the oxynitride layer.

In the gate dielectric formed, the oxynitride layer may be a nitrogen-rich oxynitride which has a nitrogen concentration in the range of between about 0.1 and about 50 atomic percent. The thickness for the spacer layer, the oxynitride layer and the $SiO_2$ may be between about 1 Å and about 40 Å. The spacer layer formed may contain 90% pure $SiO_2$ The present invention is further directed to a gate stack situated in a semiconductor memory device that includes a silicon substrate, a spacer layer overlying the silicon substrate wherein the spacer layer may be formed of substantially pure $SiO_2$, an oxynitride layer overlying the spacer layer, a silicon dioxide layer overlying the oxynitride layer and a conductive gate overlying the silicon dioxide layer.

In the gate stack formed in a semiconductor memory device, the conductive gate may be a polysilicon gate. The oxynitride layer may be a nitrogen-rich oxynitride which has a nitrogen concentration in the range between about 0.1 and about 50 atomic percent. Each of the spacer layer, the oxynitride layer and the $SiO_2$ layer may have a thickness between about 1 Å and about 40 Å. The spacer layer may be formed of a material that is substantially $SiO_2$.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
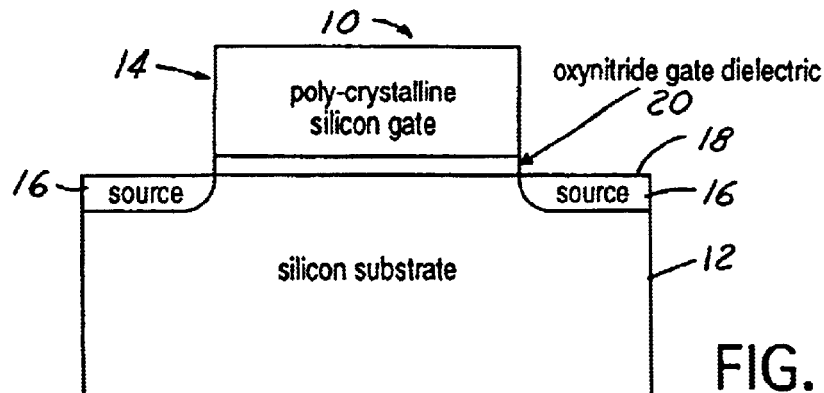
FIG. 1 is an enlarged, cross-sectional view of a semiconductor gate stack incorporating the present invention oxynitride gate dielectric.

The present invention discloses a method for forming an oxynitride gate dielectric in a semiconductor device that has controlled concentration profile of nitrogen in the oxynitride layer. The method further enables a substantially pure silicon dioxide layer to be formed in a re-oxidation process in the presence of oxygen and a halogenated species between an oxynitride layer and a silicon substrate. The oxynitride layer may be formed by either passing at least one gas that contains nitrogen and/or oxygen over the surface of a silicon substrate or by depositing in a chemical vapor deposition technique. The at least one gas that contains nitrogen and/or oxygen can be flown into a reaction chamber at a sufficiently high flow rate and chamber temperature such that a nitrogen-rich oxynitride layer which has a nitrogen concentration in the range between about 0.1 and about 50 atomic percent can be formed. The at least one gas may be NO, $N_2O$, $NH_3$ or $O_2$. The at least one gas may be flown into a reaction chamber to react with a silicon surface at a pressure between about 1 mTorr and about 20 Atm. The temperature of the silicon surface may be kept between about 500° C. and about 1200° C. The at least one gas may also contain one gas selected from NO, $N_2O$ and $NH_3$, and one gas selected from $O_2$ and $N_2O$.

The method may be carried out for forming a gate dielectric in a CMOS device by first forming an oxynitride film and then re-oxidizing the film in an oxidizing ambient such as $O_2$ containing a halogenated species such as HCl, $CH_2Cl_2$, $C_2H_3Cl_3$, $C_2H_2Cl_2$. $CH_3Cl$ and $CHCl_3$. The resulting structure formed consists of an oxide layer on top of an oxynitride layer which has a controllable nitrogen content, on top of another oxide layer that is formed on a silicon substrate. The thicknesses of these layers may vary between about 1 Å and about 40 Å.

The oxynitride film can be formed by a standard thermal treatment, such as a reaction between NO, $N_2O$ and $NH_3$ with a silicon substrate, possibly in combination with an oxidizing gas such as $O_2$ or $N_2O$. Alternatively, the oxynitride film can be formed by a CVD process, including but not limited to plasma CVD, remote plasma CVD, rapid thermal CVD and low pressure CVD.

In a preferred embodiment, the oxide film can be formed in a reaction of a clean silicon surface with NO gas at a pressure between about 1 mTorr and about 20 atm, and at a temperature between about 500° C. and about 1200° C. The process forms a nitrogen-rich oxynitride film that has a nitrogen concentration in the range between about 0.1 and about 50 atomic percent. The process forms a film that is uniform across the surface of the wafer which has a standard deviation in thickness 10 times narrower than a film formed with $N_2O$. The secondary process, i.e., the re-oxidation process can be carried out as a thermal process in an oxidizing halogenated atmosphere, such as $O_2+CH_2Cl_2$, at a pressure between about 1 mTorr and about 20 atm at a temperature between about 500° C. and about 1200° C. The purpose of the re-oxidation process is to optimize the nitrogen profile within the oxynitride layer. The oxygen causes a growth of a substantially pure $SiO_2$ underneath the oxynitride layer. By substantially pure, it is meant a $SiO_2$ layer that contains at least 90% $SiO_2$. The halide species serves to assist in the removal of nitrogen from the oxynitride. The present invention novel method therefore, by optimizing the oxygen and halogen-containing species flow rates, the pressure, the temperature, etc., is capable of optimizing the nitrogen profile in the oxynitride film layer resulting in desirable optimal balance of film thickness uniformity, Vfb and channel hot carrier reliability.

The present invention method differs from another nitrogen optimization method, where an $N_2O$ anneal is used to remove N from the oxynitride, in two major aspects. First, in the $N_2O$ reoxidation method, nitrogen is completely removed from the oxynitride layer during a re-oxidation process. In the present invention method, a controlled amount of nitrogen is left in the oxynitride layer depending on the re-oxidation conditions. Secondly, in the method of $N_2O$ re-oxidation, a second oxynitride layer will be formed between the oxynitride layer and the silicon substrate. In the present invention method, a substantially pure $SiO_2$ layer is inserted underneath the dielectric. The present invention method therefore addresses the problem of de-coupling the nitrogen content of the oxynitride film from the film thickness and uniformity. For instance, a low nitrogen concentration at the $Si/SiO_2$ interface may be desirable for achieving good device properties (such to as Vfb shift). However, both a narrow thickness distribution and a thick oxide spacer layer may be needed. In such a case, nitrogen may be introduced by NO oxidation at a temperature of 850° C., giving rise to concentrations of roughly $6 \times 10^{14}/cm^2$. This nitrogen concentration is large enough to inhibit the in diffusion of oxidizing species and thus contributes to the spatial uniformity of the dielectric layer. During the re-oxidation step, the present invention method selectively removes the nitrogen atoms from the film by the addition of a halogen containing species such as methyl chloride to the gaseous ambient. This addition serves to reduce the shift in Vfb and other deleterious effects of nitrogen while maintaining the narrow thickness distribution typical of nitrided oxides. Referring now to FIG. 1, wherein an enlarged, cross-sectional view of a gate stack 10 incorporating the present invention gate dielectric 20 is shown. The gate dielectric 20 is built on silicon substrate 12 and subsequently, a polysilicon gate 14 is formed on top of the gate dielectric 20. The silicon substrate 12 is further provided with source regions 16 in a top surface 18.

Figure 2A:
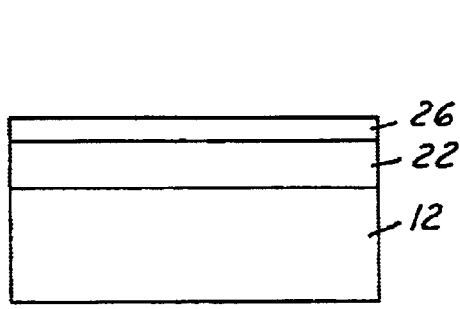
FIG. 2A is an enlarged, cross-sectional view of the present invention gate dielectric after an oxynitride layer is first formed on a silicon substrate.
Figure 2B:
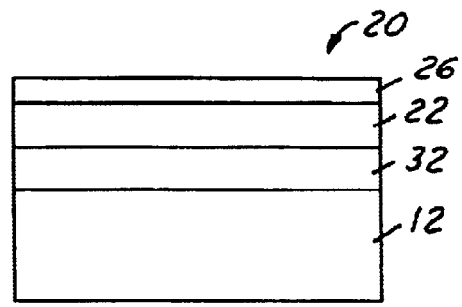
FIG. 2B is an enlarged, cross-sectional view of the present invention gate dielectric of FIG. 2A after a re-oxidation process is carried out for forming a silicon dioxide layer between the oxynitride layer and the silicon substrate.

FIGS. 2A and 2B illustrate enlarged, cross-sectional views of the present invention gate dielectric structure 20. The oxynitride film 22 may be formed by one of two methods. In the first method of a standard thermal treatment process, at least one gas of NO, $N_2O$ or $NH_3$ is reacted with a silicon substrate 12, optionally in combination with an oxidizing gas such as $O_2$ or $N_2O$. For instance, in a preferred embodiment for forming the oxynitride film 22, a clean surface of silicon is reacted with NO gas at a pressure between about 1 mTorr and about 20 atm, and at a temperature between about 500° C. and about 1200° C. A preferred range of reaction temperature is between about 650° C. and about 950° C. In a second method for forming the oxynitride film, a CVD process such as plasma CVD, remote plasma CVD, rapid thermal CVD or low pressure CVD is used to form the oxynitride film. By either of the methods, a nitrogen-rich oxynitride layer which has a nitrogen concentration in the range between about 0.1 and about 50 atomic percent is formed. The oxynitride film formed has a more uniform thickness across the surface of the wafer, as indicated by a standard deviation in thickness that is 10× narrower than that achieved with $N_2O$ reaction. The oxynitride film layer 22 may, or may not, have other components such as a substantially pure $SiO_2$ layer 26 on top of the oxynitride layer 22.

After the oxynitride film 22 is formed, the silicon substrate 12 is re-oxidized at an elevated temperature, i.e., between about 500° C. and about 1200° C., in an ambient containing an oxidizing and a halogenated species. The oxidizing agent, such as $O_2$ or $N_2O$, diffuses through the oxynitride layer 22 to create an oxide spacer layer 32 underneath the oxynitride layer 22. The halogenated species, such as HCl, $CH_2Cl_2$, $C_2H_3Cl_3$, $C_2H_2Cl_2$. $CH_3Cl$ and $CHCl_3$, simultaneously acts to reduce the nitrogen content in the oxynitride layer 22 thus allowing a controlled nitrogen profile.

The re-oxidation process can be carried out as a thermal process in which an oxidizing halogenated atmosphere is provided at a pressure between about 1 mTorr and about 20 atm, and at a temperature between about 500° C. and about 1200° C. The purpose of the re-oxidation process is therefore to optimize the nitrogen profile within the oxynitride film layer. The oxygen causes the growth of substantially pure $SiO_2$ under the oxynitride film layer 22, while the halide species serves to assist in the partial removal of nitrogen from the oxynitride layer 22.

Figure 3:
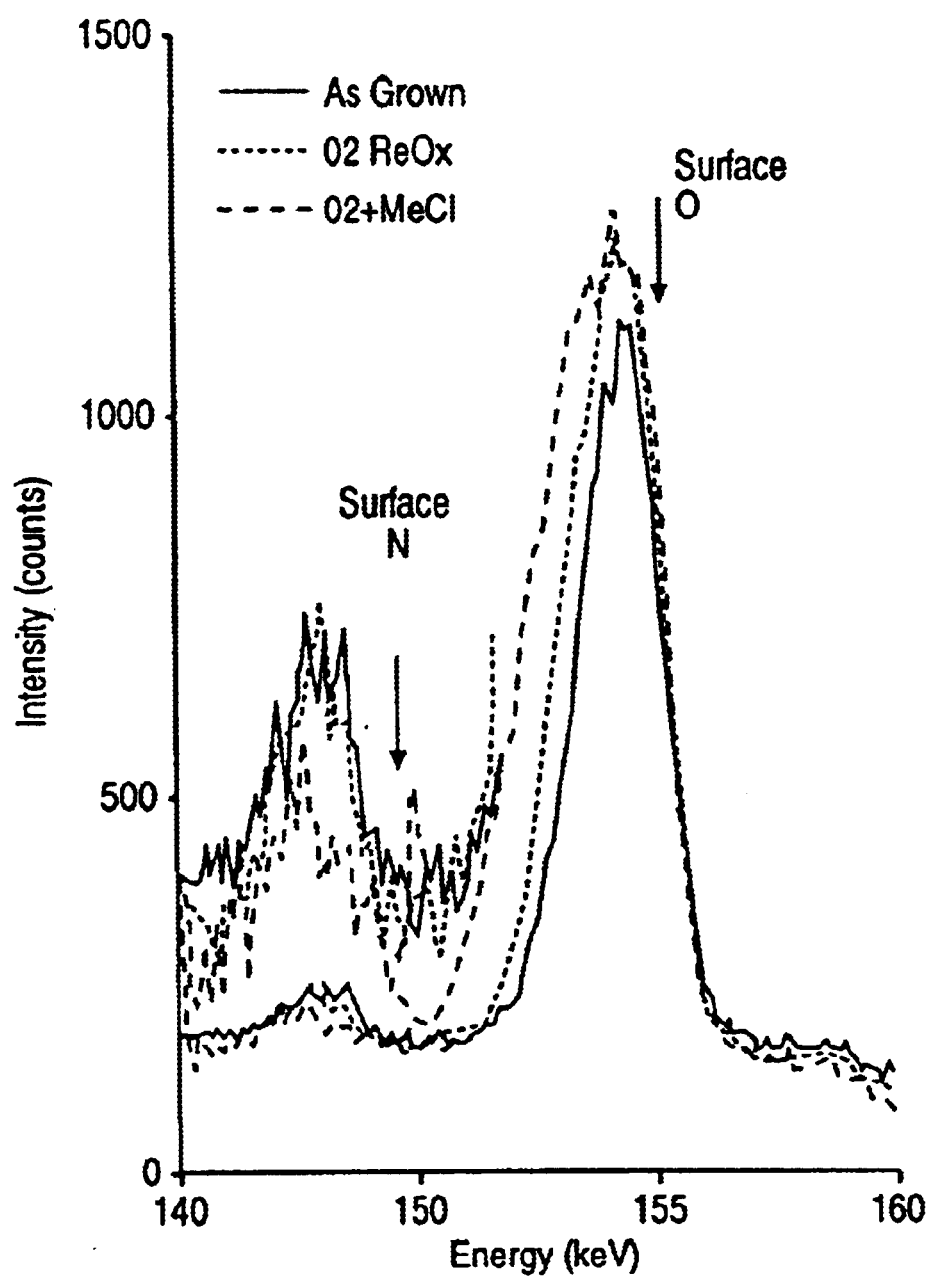
FIG. 3 is a graph illustrating spectra of medium energy ion scattering (MEIS) obtained on the present invention oxynitride layer.

The effectiveness of the present invention method is illustrated in FIG. 3, which are spectra taken by a medium energy ion scattering (MEIS) technique. The spectra which show the oxygen and nitrogen peaks for 200 keV He ions backscattered from three different dielectric layers. The figure also contains an inset which contains a magnification of the nitrogen peaks by a factor of five. A sample which has only undergone NO oxidation at 850° C. with no further processing (labeled as "as grown") has an oxygen peak at about 155 keV and a nitrogen peak at about 147 keV. The size and shape of the nitrogen peak indicate the depth distribution and the concentration of nitrogen. After re-oxidizing in a pure oxygen ambient at 850° C., the oxygen peak is broadened to indicate that the dielectric is now thicker (labeled in FIG. 3 as "$O_2$ Re Ox"), while the nitrogen peak is unchanged both in amplitude and in position. This indicates that the re-oxidation process has left the nitrogen undisturbed and an underlying $SiO_2$ layer is inserted without removing any nitrogen. When this spectra is compared with a spectra obtained by re-oxidation in an ambient containing methyl chloride (labeled as "$O_2$+MeCl" in FIG. 3), there is a substantial reduction in the size of the nitrogen peak indicating a two-fold reduction in the nitrogen quantity in the film.

Figure 4:
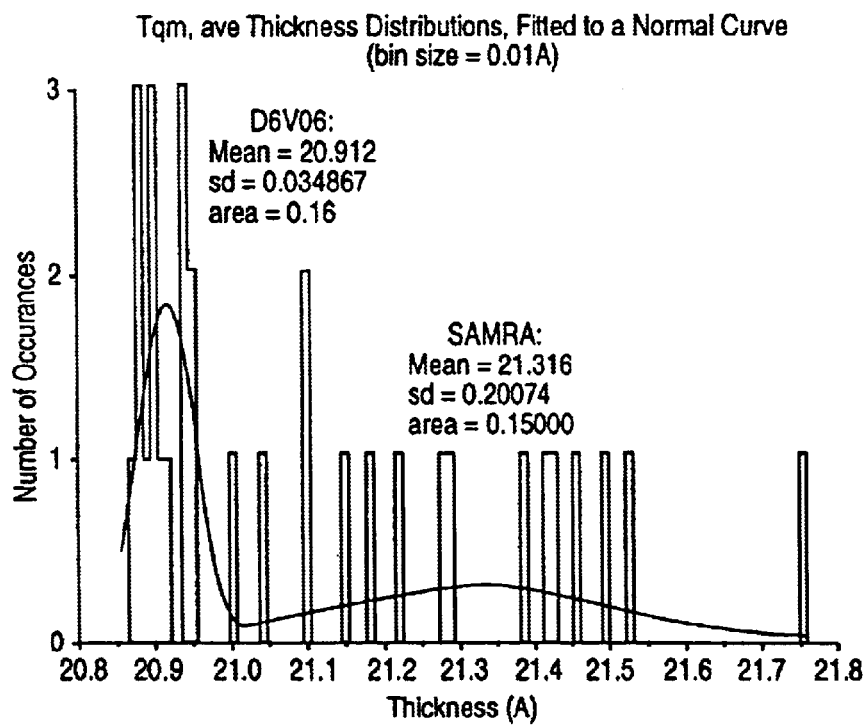
FIG. 4 is a graph illustrating a histogram plot of film uniformity of the present invention oxynitride layer.

The effectiveness of the present invention method can be further illustrated in a histogram showing the film uniformity across an 8" wafer, in FIG. 4. On the right side are results for an $N_2O$ oxide showing a mean thickness of 21.3 Å and a standard deviation of 0.20 Å. On the left, results are plotted for a NO re-oxidation sample which has a mean thickness of 20.9 Å and a standard deviation of 0.035 Å. The reduction in the standard deviation of thicknesses greatly improves the uniformity of electrical results for IC chips made from different regions of a silicon wafer.

The present invention novel method has therefore been amply demonstrated in the above descriptions and in the appended drawings of FIGS. 1–4. While the present invention has been described in an illustrative manner, it should be understood that the terminology used is intended to be in a nature of words of description rather than of limitation. Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A gate dielectric situated in a semiconductor device comprising:
   a silicon substrate,
   a spacer layer overlying said silicon substrate, said spacer layer being formed of substantially $SiO_2$,
   an oxynitride layer formed by NO reoxidation method having a thickness between 1 Å and 40 Å and a standard deviation of the thickness from 0.001 Å to 0.035 Å overlying said spacer layer, and
   a $SiO_2$ layer overlying said oxynitride layer.

2. A gate dielectric situated in a semiconductor device according to claim 1, wherein each of said spacer layer and said oxynitride layer has a thickness between 1 Å and 40 Å.

3. A gate dielectric situated in a semiconductor device according to claim 1, wherein said spacer layer is formed of a material containing at least 90% $SiO_2$.

4. A gate stack situated in a semiconductor device comprising:
   a silicon substrate,
   a spacer layer overlying said silicon substrate, said spacer layer being formed of substantially $SiO_2$,
   an oxynitride layer formed by NO reoxidation method having a thickness between 1 Å to 40 Å and a standard deviation of the thickness from 0.001 Å to 0.035 Å overlying the spacer layer,
   a $SiO_2$ layer overlying said oxynitride layer, and
   a conductive gate overlying said $SIO_2$ layer.

5. A gate stack situated in a semiconductor device according to claim 4, wherein said conductive gate is a polysilicon gate.

6. A gate stack situated in a semiconductor device according to claim 4, wherein said oxynitride layer is a nitrogen-rich oxynitride having a nitrogen concentration in the range between about 1 and about 50 atomic percent.

7. A gate stack situated in a semiconductor device according to claim 4, wherein each of said spacer layer, said oxynitride layer and said $SiO_2$ has a thickness between 1 Å and 40 Å.

8. A gate stack situated in a semiconductor device according to claim 4, wherein said spacer layer being formed of a material containing at least 90% $SiO_2$.

9. A gate dielectric situated in a semiconductor device comprising:
   a silicon substrate having a top surface,
   a spacer layer overlying said top surface of the silicon substrate, said spacer layer being formed of at least 90% $SiO_2$, and
   said oxynitride layer formed by NO reoxidation method having a thickness between 1 Å and 40 Å and a standard deviation of the thickness from 0.001 Å to 0.035 Å.

* * * * *